(12) United States Patent
Arai et al.

(10) Patent No.: US 9,966,381 B2
(45) Date of Patent: May 8, 2018

(54) SEMICONDUCTOR MEMORY DEVICE AND METHOD FOR MANUFACTURING THE SAME

(71) Applicant: Toshiba Memory Corporation, Minato-ku (JP)

(72) Inventors: Fumitaka Arai, Yokkaichi (JP); Tatsuya Kato, Yokkaichi (JP); Satoshi Nagashima, Yokkaichi (JP); Katsuyuki Sekine, Yokkaichi (JP); Yuta Watanabe, Yokkaichi (JP); Keisuke Kikutani, Yokkaichi (JP); Atsushi Murakoshi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/267,776

(22) Filed: Sep. 16, 2016

(65) Prior Publication Data
US 2017/0271348 A1 Sep. 21, 2017

Related U.S. Application Data

(60) Provisional application No. 62/310,224, filed on Mar. 18, 2016.

(51) Int. Cl.
*H01L 27/115* (2017.01)
*H01L 21/28* (2006.01)
(Continued)

(52) U.S. Cl.
CPC .. *H01L 27/11556* (2013.01); *H01L 21/28273* (2013.01); *H01L 21/31051* (2013.01);
(Continued)

(58) Field of Classification Search
CPC ......... H01L 27/11556; H01L 27/11519; H01L 21/28273; H01L 21/31051;
(Continued)

(56) References Cited

U.S. PATENT DOCUMENTS 7,855,457 B2 12/2010 Mizukami et al.
9,431,412 B1 * 8/2016 Kato ................ H01L 27/11556
(Continued)

FOREIGN PATENT DOCUMENTS

| JP | 2009-16400 A | 1/2009 |
| JP | 2011-60838 A | 3/2011 |
| JP | 2013-187335 A | 9/2013 |

(Continued)

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

A semiconductor memory device includes a semiconductor substrate, a first insulating film provided on the semiconductor substrate, a first conductive film provided on a first region of the first insulating film, a second conductive film provided on a second region of the first insulating film, a first stacked body provided on the first conductive film, a second stacked body provided on the second conductive film, a first semiconductor pillar, and two conductive pillars. In the first stacked body, a second insulating film and an electrode film are stacked alternately. In the second stacked body, a third insulating film and a first film are stacked alternately. The two conductive pillars extend in the first direction through the second stacked body, are separated from the second conductive film, sandwich the second conductive film, and are connected at a bottom ends of the second conductive pillars to the semiconductor substrate.

11 Claims, 21 Drawing Sheets

(51) Int. Cl.
- *H01L 21/768* (2006.01)
- *H01L 23/535* (2006.01)
- *H01L 29/788* (2006.01)
- *H01L 21/3105* (2006.01)
- *H01L 27/11556* (2017.01)
- *H01L 27/11519* (2017.01)

(52) U.S. Cl.
CPC .. *H01L 21/76802* (2013.01); *H01L 21/76877* (2013.01); *H01L 23/535* (2013.01); *H01L 27/11519* (2013.01); *H01L 29/7883* (2013.01)

(58) Field of Classification Search
CPC ......... H01L 21/76802; H01L 21/76877; H01L 23/535; H01L 29/7883
USPC .................................................. 257/316, 314
See application file for complete search history.

(56) References Cited

U.S. PATENT DOCUMENTS

| | | |
|---|---|---|
| 2009/0230450 A1* | 9/2009 | Shiino ............... H01L 27/11582 257/314 |
| 2011/0057251 A1 | 3/2011 | Higashi et al. |
| 2011/0065272 A1 | 3/2011 | Mizukami et al. |
| 2013/0234332 A1 | 9/2013 | Iino et al. |
| 2014/0042620 A1 | 2/2014 | Mizukami et al. |
| 2014/0217611 A1 | 8/2014 | Mizukami et al. |
| 2015/0036407 A1 | 2/2015 | Nakajima |
| 2016/0079252 A1 | 3/2016 | Yamashita |
| 2016/0197035 A1 | 7/2016 | Mizukami et al. |

FOREIGN PATENT DOCUMENTS

| | | |
|---|---|---|
| JP | 2015-28989 A | 2/2015 |
| WO | WO 2016/139727 A1 | 9/2016 |

* cited by examiner

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/310,224, filed on Mar. 18, 2016; the entire contents of which are incorporated herein by reference.

FIELD

Embodiments relate to a semiconductor memory device and a method for manufacturing the same.

BACKGROUND

A stacked semiconductor memory device including a stacked body with conductive films and insulating films stacked alternately, a semiconductor pillar penetrating the stacked body, and transistors disposed at the peripheral portion of the stacked body has been proposed. With stacked semiconductor memory devices, it is desirable to reduce the number of manufacturing processes.

DETAILED DESCRIPTION

A semiconductor memory device according to one embodiment, includes a semiconductor substrate, a first insulating film provided on the semiconductor substrate, a first conductive film provided on a first region of the first insulating film, a second conductive film provided on a second region of the first insulating film, a first stacked body provided on the first conductive film, a second stacked body provided on the second conductive film and a region in a periphery of the second conductive film, a first semiconductor pillar, two conductive pillars, and a charge storage member. In the first stacked body, a second insulating film and an electrode film are stacked alternately along a first direction from the semiconductor substrate towards the first insulating film. In the second stacked body, a third insulating film and a first film are stacked alternately in the first direction. The first semiconductor pillar extends in the first direction through the first stacked body, and is connected at a bottom end of the first semiconductor pillar to the first conductive film. The two conductive pillars extend in the first direction through the second stacked body, are separated from the second conductive film, sandwich the second conductive film, and are connected at a bottom ends of the second conductive pillars to the semiconductor substrate. The charge storage member is provided between the first semiconductor pillar and the electrode film.

Hereinafter, embodiments of the invention will be described below with reference to the drawings.

Figure 1:
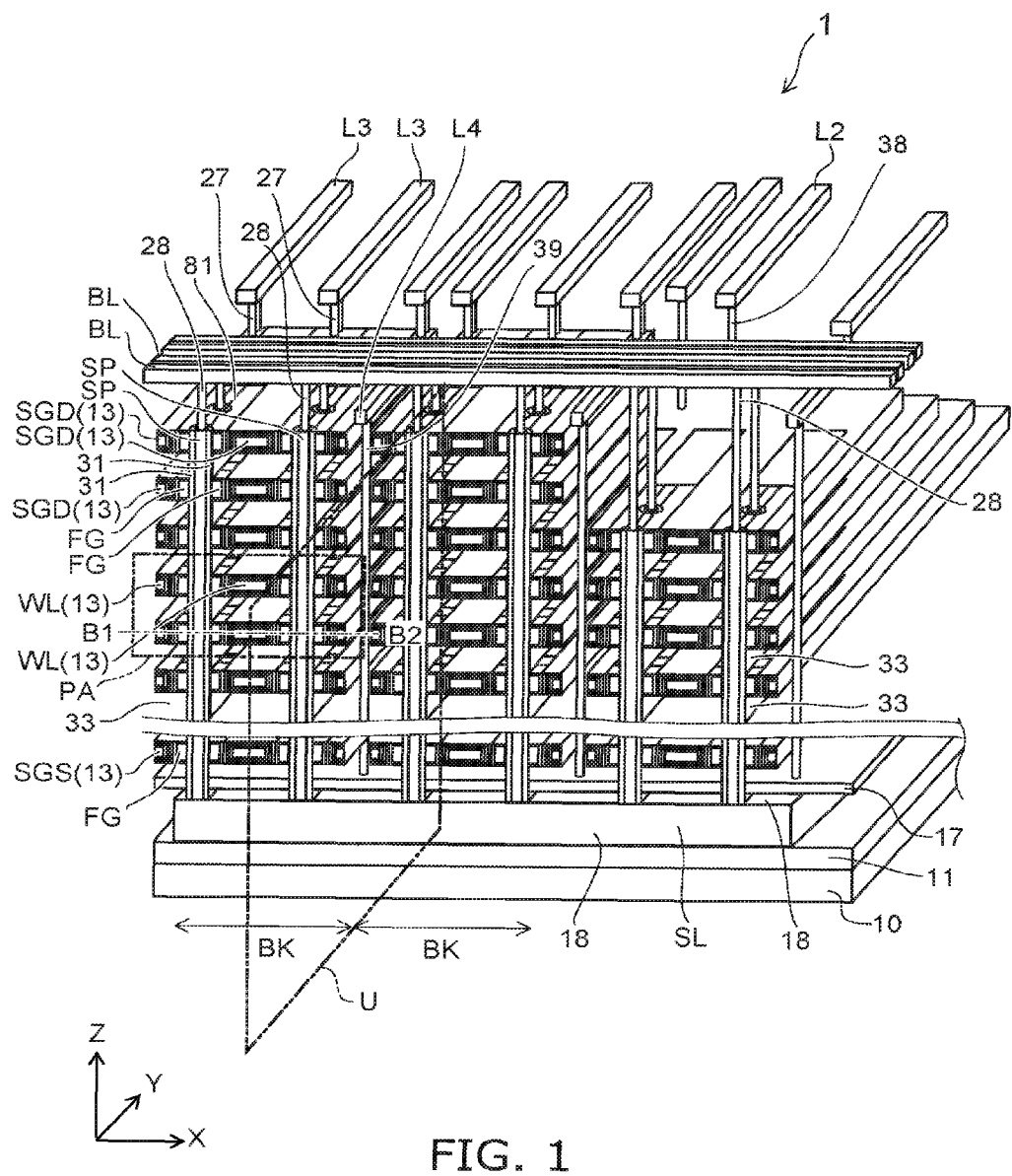
FIG. 1 is a perspective view illustrating an example of a semiconductor memory device according to an embodiment.

FIG. 1 is a perspective view illustrating an example of the semiconductor memory device according to an embodiment.

As illustrated in FIG. 1, a plurality of silicon pillars SP (pillars) are provided in a semiconductor memory device 1 according to the embodiment. The plurality of silicon pillars SP extend in a first direction. The first direction is defined as the Z-direction. One direction perpendicular to the Z-direction is defined as the X-direction (second direction). The direction perpendicular to the Z-direction and perpendicular to the X-direction is defined as the Y-direction (third direction).

For example, in the semiconductor memory device 1, a silicon substrate 10 is provided, and the plurality of silicon pillars SP are provided on the silicon substrate 10.

In the specification, the state in which a second element is provided on a first element includes the state in which the second element physically contacts the first element, and the state in which a third element is provided between the second element and the first element.

In an example of the semiconductor memory device 1, the silicon substrate 10 is provided, and an insulating film 11 is provided on the silicon substrate 10. A source line SL is provided on the insulating film 11.

The silicon pillars SP extending in the Z-direction are provided on the source line SL. The silicon pillars SP and the source line SL are electrically connected. A stacked body 32 is provided around the silicon pillars SP. The stacked body 32 includes an electrode film 13 and an insulating film 33 arranged alternately. An insulating film 17 and an insulating member 18 are provided between the stacked body 32 and the source line SL.

A tunnel insulating film 31 is provided between the silicon pillar SP and the stacked body 32. A floating gate electrode film FG is provided between the tunnel insulating film 31 and the electrode film 13. The floating gate electrode film FG is separated from the silicon pillars SP in the X-direction. A block insulating film 50 is provided between the floating gate electrode film FG and the electrode film 13. The stacked film formed from the tunnel insulating film 31, the floating gate electrode film FG, and the block insulating film 50 is referred to as a memory film 30.

Bit lines BL are provided on the silicon pillars SP. The bit lines BL extend in the X-direction. A contact 28 extending in the Z-direction is provided between the silicon pillar SP and the bit line BL.

The electrode film 13 on the lower portion of the stacked body 32 is referred to as a source-side select gate electrode SGS. The source-side select gate electrode SGS extends in the Y-direction. The electrode film 13 on the upper portion of the stacked body 32 is referred to as a drain-side select gate electrode SGD. The drain-side select gate electrode SGD extends in the Y-direction. The electrode films 13 between the drain-side select gate electrode SGD and the source-side select gate electrode SGS are referred to as word lines WL. The word lines WL extend in the Y-direction. The current flowing in the silicon pillars SP varies in accordance with the voltage applied to the word line WL.

A contact 39 extending in the Z-direction is provided on the portion of the source line SL where the silicon pillars SP are not disposed. An interconnection L4 extending in the Y-direction is provided on the contact 39.

Figure 2:
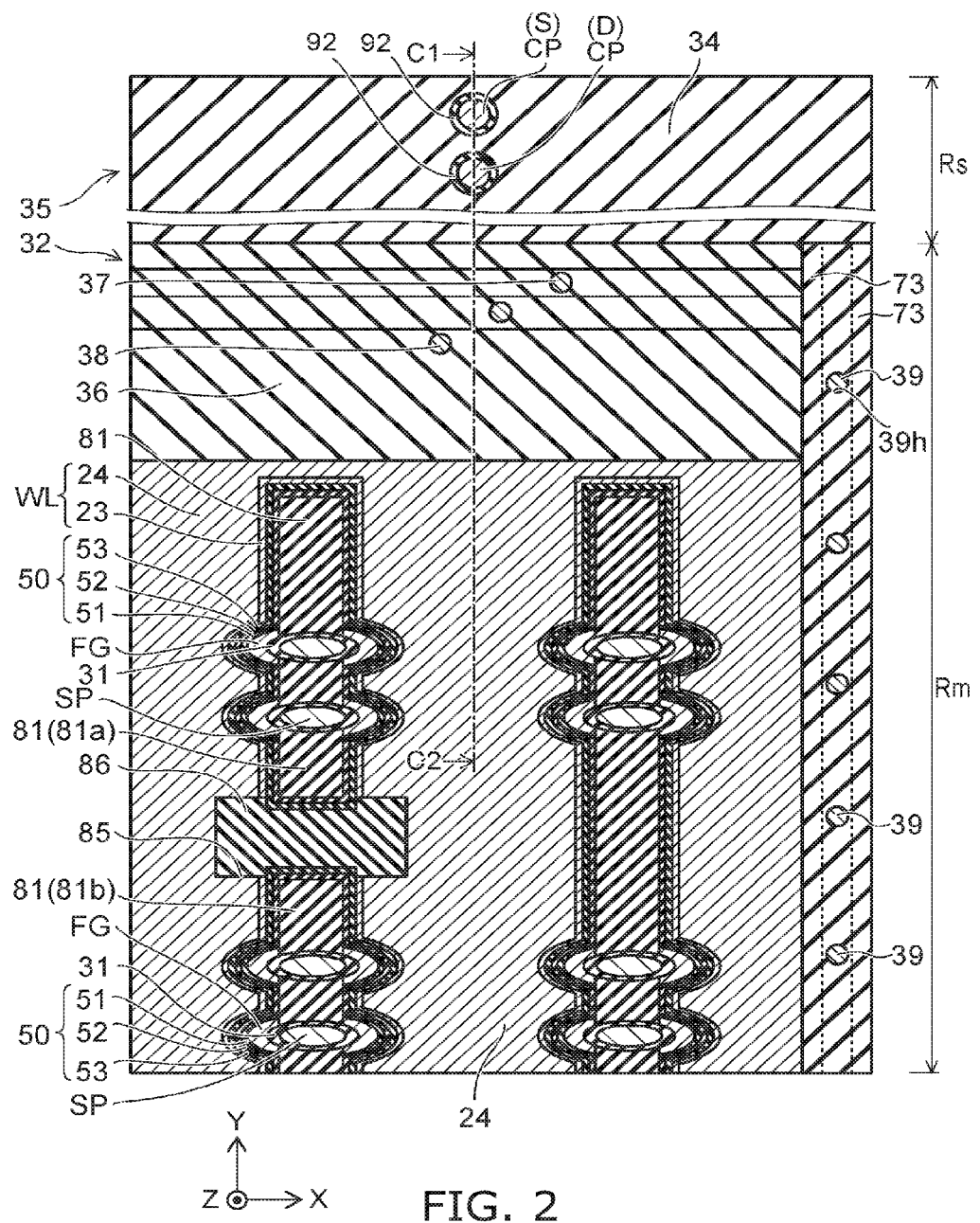
FIG. 2 is a schematic cross-sectional view taken along the line B1-B2 in FIG. 1.

FIG. 2 is a schematic cross-sectional view taken along the line B1-B2 in FIG. 1.

Figure 3:
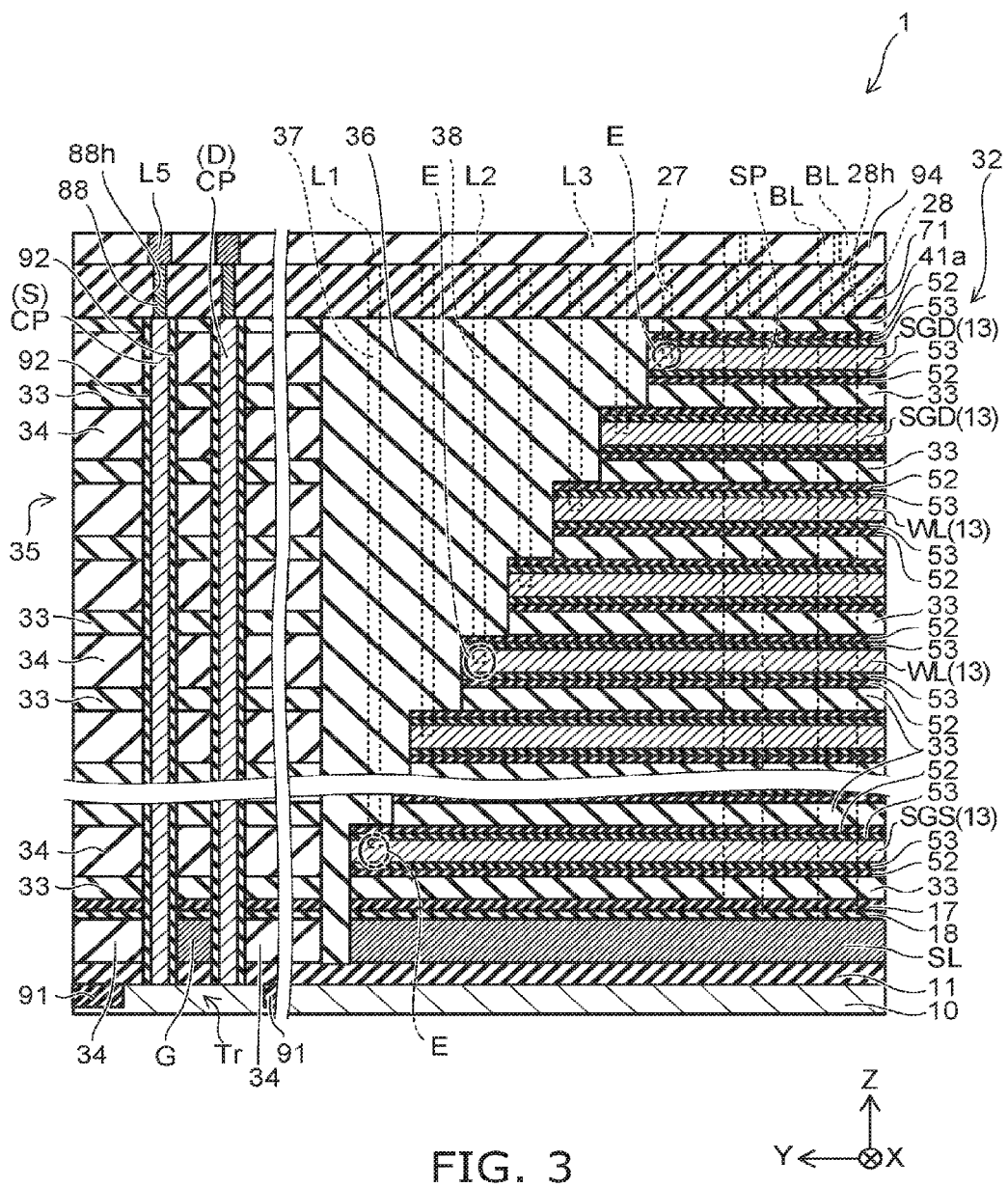
FIG. 3 is a schematic cross-sectional view taken along the line C1-C2 in FIG. 2.

FIG. 3 is a schematic cross-sectional view taken along the line C1-C2 in FIG. 2.

As illustrated in FIG. 2 and FIG. 3, a stacked body 35 is provided on the Y-direction side of the stacked body 32. The stacked body 35 is separated from the stacked body 32. In the stacked body 35, an insulating film 33 made from, for example, silicon oxide and a filling film 34 made from, for example, silicon nitride are alternatively stacked, and an electrode film 13 is not provided. The insulating film 33 of the stacked body 32 and the insulating film 33 of the stacked body 35 are the same film but divided, and they have the same film thickness and average composition as each other.

A conductive pillar CP is provided in the stacked body 35. The shape of the conductive pillar in the XY plane is, for example, an ellipse. The maximum width of the conductive pillar CP along the X-direction is different from the maximum width of the conductive pillar CP along the Y-direction.

The shape of the silicon pillars SP in the XY plane is, for example, an ellipse. The maximum width of the silicon pillars SP along the X-direction is different from the maximum width of the silicon pillars SP along the Y-direction. The shape of the floating gate electrode film FG in the XY plane is an approximately semi-circular arch shape with no center portion. An insulating member 81 is provided between two silicon pillars SP disposed along the Y-direction. The insulating member 81 is provided extending in the Z-direction on the source layer SL. The insulating member 81 overlaps with the silicon pillars SP when viewed from the Y-direction. An insulating member 73 is provided on the source line SL, separated from the silicon pillars SP in the X-direction and spreading along the YZ plane.

A plurality of insulating members 81 are provided, and are, for example, an insulating member 81a and an insulating member 81b. The insulating member 81b is separated from the insulating member 81a in the Y-direction and extends in the Z-direction. An insulating member 86 extending in the Z-direction is provided between the insulating member 81a and the insulating member 81b.

As illustrated in FIG. 3, the shape of the end portion of the stacked body 32 on the stacked body 35 side is a stairs shape formed with steps at each electrode film 13. The positions of the end portions E in the Y-direction of the plurality of electrode films 13 separated from each other in the Z-direction are different from each other. The lengths in the Y-direction of each of the plurality of electrode films 13 are different from each other.

A contact 37 is provided on an end portion E of the source-side select gate electrode SGS. The contact 37 extends in the Z-direction. An interconnection L1 is provided on the contact 37. The interconnection L1 extends in the Y-direction.

A contact 27 is provided on an end portion E of the drain-side select gate electrode SGD. The contact 27 extends in the Z-direction. An interconnection L3 is provided on the contact 27. The interconnection L3 extends in the Y-direction.

End portions E of the plurality of word lines WL whose positions in the Z-direction are the same as each other form a single bundle. A contact 38 is provided on the end portions E of the word lines WL forming the single bundle. The contact 38 extends in the Z-direction. An interconnection L2 is provided on the contact 38. The interconnection L2 extends in the Y-direction. An interlayer insulating film 36 is provided on the insulating film 17.

On the other hand, the shape of the stacked body 35 on the stacked body 32 side is not a stairs shape, but forms a substantially vertical side face.

Within the stacked body 35, the conductive pillar CP extends in the Z-direction. An insulating member 92 is provided between the conductive pillar CP and the stacked body 32. The conductive pillar CP and the silicon substrate 10 are electrically connected. The length of the insulating member 92 along the X-direction is longer than the length of the conductive pillar CP along the X-direction. The composition of the insulating member 92 is the same as the composition of the insulating member 81, for example, silicon oxide. The length of the insulating member 73 in the X-direction is longer than the length of the insulating member 81 in the X-direction.

A contact 88 is provided on the conductive pillar CP. The contact 88 extends in the Z-direction. An interconnection L5 is provided on the contact 88.

For example, two conductive pillars CP are provided. Of the two conductive pillars CP, one is referred to as a source electrode S, and the other is referred to as a drain electrode D. A gate electrode G is provided between the source electrode S and the drain electrode D, between the stacked body 35 and the silicon substrate 10. The two conductive pillars CP are separated from the gate electrode G.

The gate electrode G is the same layer as the source line SL in a memory region. In other words, the distance between the substrate 10 and the gate electrode G is equal to the distance between the substrate 10 and the source line SL. Also, the film thickness, the film configuration, and the average composition of the gate electrode G are substantially the same as the film thickness, film configuration, and average composition of the source line SL. The source line SL and the gate electrode G are, for example, three layer films in which a silicon layer, a tungsten layer, and a silicon layer are stacked in that order. The gate electrode G is divided from the source line SL. The insulating film 11 extends between the gate electrode G and the silicon substrate 10. A transistor Tr is formed by the gate electrode G, the silicon substrate 10, the source electrode S, and the drain electrode D. The insulating film 11 positioned between the gate electrode G and the silicon substrate 10 forms a gate insulation film of the transistor Tr. The current flowing through the silicon substrate 10 via the source electrode S (one of the conductive pillars CP) and the drain electrode D (the other one of the conductive pillars CP) varies in accordance with the voltage applied to the gate electrode G. The resistance of the silicon substrate 10 from the connection point between the source electrode S and the silicon substrate 10 to the connection point between the drain electrode D and the silicon substrate 10 varies in accordance with the voltage applied to the gate electrode G.

The connection point to the source electrode S, the connection point to the drain electrode D, and, a shallow trench isolation (STI) 91 may be provided in a portion of the top layer of the silicon substrate 10 and surround the region directly below the gate electrode G.

Figure 4:
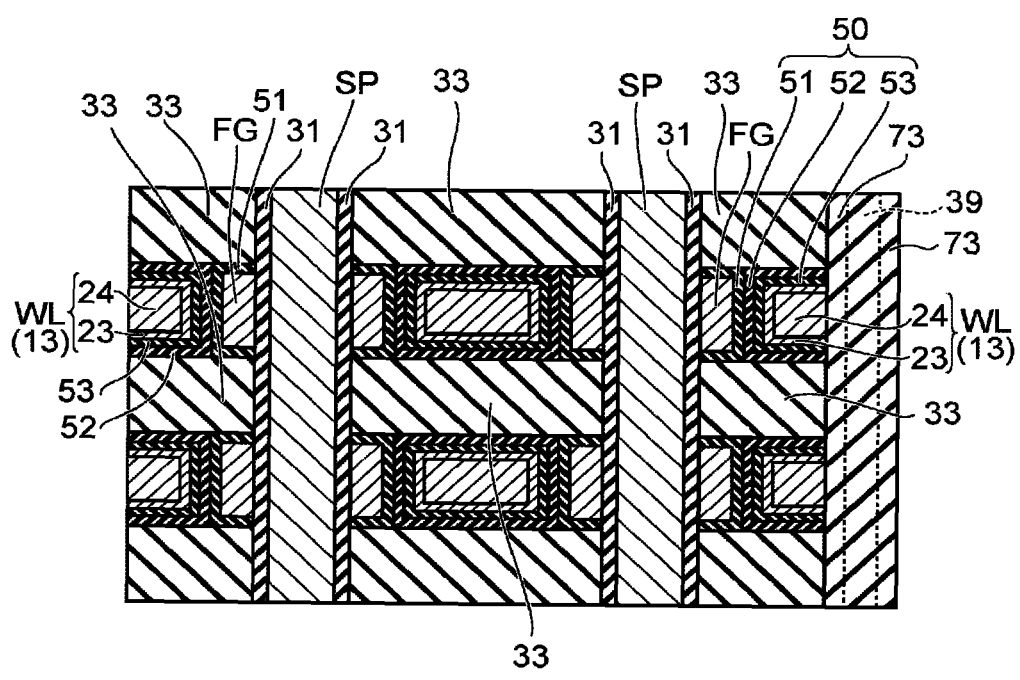
FIG. 4 is a cross-sectional view illustrating a portion of the semiconductor memory device according to the embodiment.

FIG. 4 is a cross-sectional view illustrating a portion of the semiconductor memory device according to the embodiment.

As illustrated in FIG. 4, the electrode film 13 is interposed between the two silicon pillars SP adjacent to each other in the X-direction in a portion PA illustrated in FIG. 1. A conductive member 24 and a barrier metal film 23 are provided in the electrode film 13. The barrier metal film 23 is provided on the top face and on the bottom face of the conductive member 24, and on the side face facing towards the silicon pillar SP. The floating gate electrode film FG is provided between the electrode film 13 and the tunnel insulating film 31. A block insulating film 51 is provided between the floating gate electrode film FG and the electrode film 13, and between the floating gate electrode film FG and the insulating film 33.

A block insulating film 52 is provided between the block insulating film 51 and the conductive member 24, and between the conductive member 24 and the insulating film 33. A block insulating film 53 is provided between the block insulating film 52 and the conductive member 24, and between the conductive member 24 and the insulating film 52. The block insulating films 52 and 53 are provided between the floating gate electrode film FG and the electrode film 13, and, between the insulating member 81 and the electrode film 13, but are not provided between the insulating member 86 and the electrode film 13.

The stacked film including the block insulating film 51, the block insulating film 52, and the block insulating film 53 is referred to as a block insulating film 50. The word line WL includes the barrier metal film 23 and the conductive member 24.

The following is an example of the material of each part.

The silicon substrate 10 is formed from, for example, a semiconductor material that includes silicon (Si). The insulating film 33 is formed from, for example, silicon oxide ($SiO_2$). The interconnections L1 to L6, the bit lines BL, the word lines WL, the source electrodes 5, and the drain electrodes D are formed from, for example, tungsten (W). The tunnel insulating film 31 is formed from, for example, silicon oxide.

The following is an example of a method of manufacturing the semiconductor memory device according to the embodiment.

FIGS. 5A to 21 are cross-sectional views illustrating a method of manufacturing the semiconductor memory device according to the embodiment.

Figure 5A:
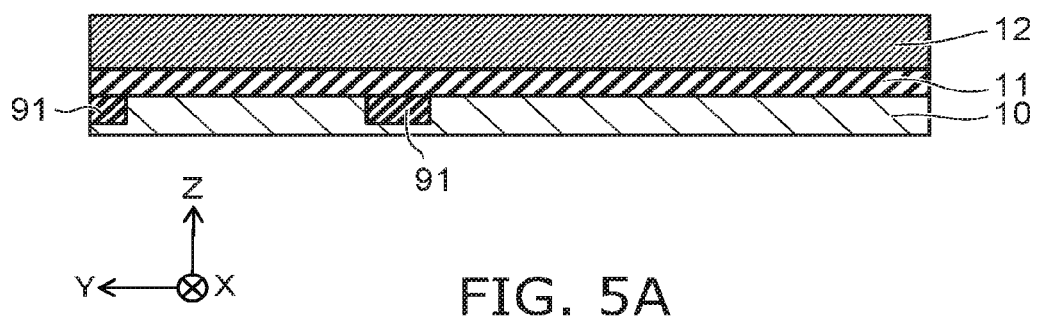
FIGS. 5A to 5C are cross-sectional views illustrating a method of manufacturing a semiconductor memory device according to an exemplary embodiment.

First, as illustrated in FIG. 5A, the STI 91 is selectively formed in the top layer portion of the silicon substrate 10. Next, for example, silicon oxide is deposited on the silicon substrate 10 to form the insulating film 11. The silicon substrate 10 includes a peripheral region Rs and a memory region Rm. Conductive material is deposited on the insulating film 11 to form the conductive layer 12.

Figure 5B:
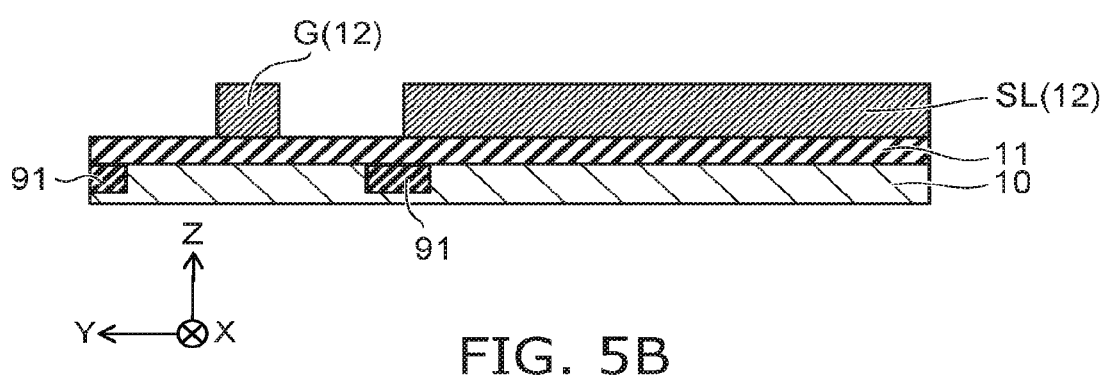

Next, as illustrated in FIG. 5B, for example, dry etching is carried out to selectively remove the conductive layer 12. In this way, the source line SL is formed in the memory region Rm, and the gate electrode G (not illustrated on FIG. 5B) is formed on a portion of the peripheral region Rs. After embedding insulating material between the source line SL and the gate electrode G, planarizing is carried out.

Figure 5C:
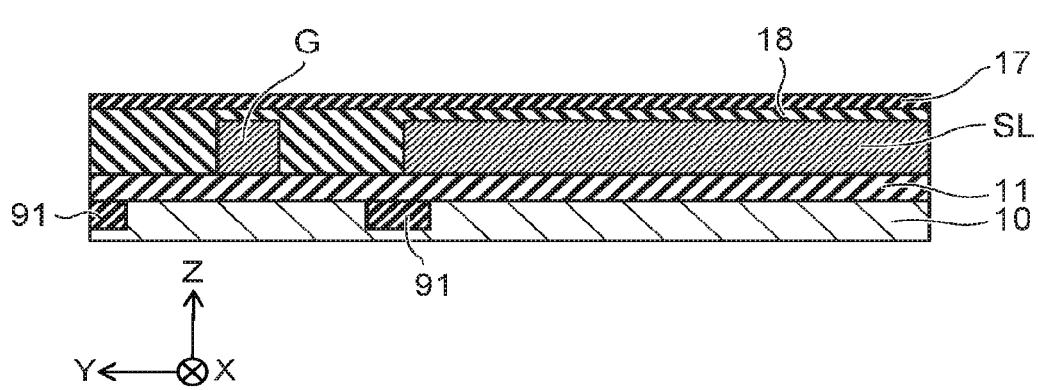

Next, as illustrated in FIG. 5C, insulating material is deposited on the top surface of the insulating film 11, the top surface of the source line SL, and the top surface of the gate electrode G, to form the insulating member 18. The insulating layer 17 is formed on the insulating member 18.

Figure 6:
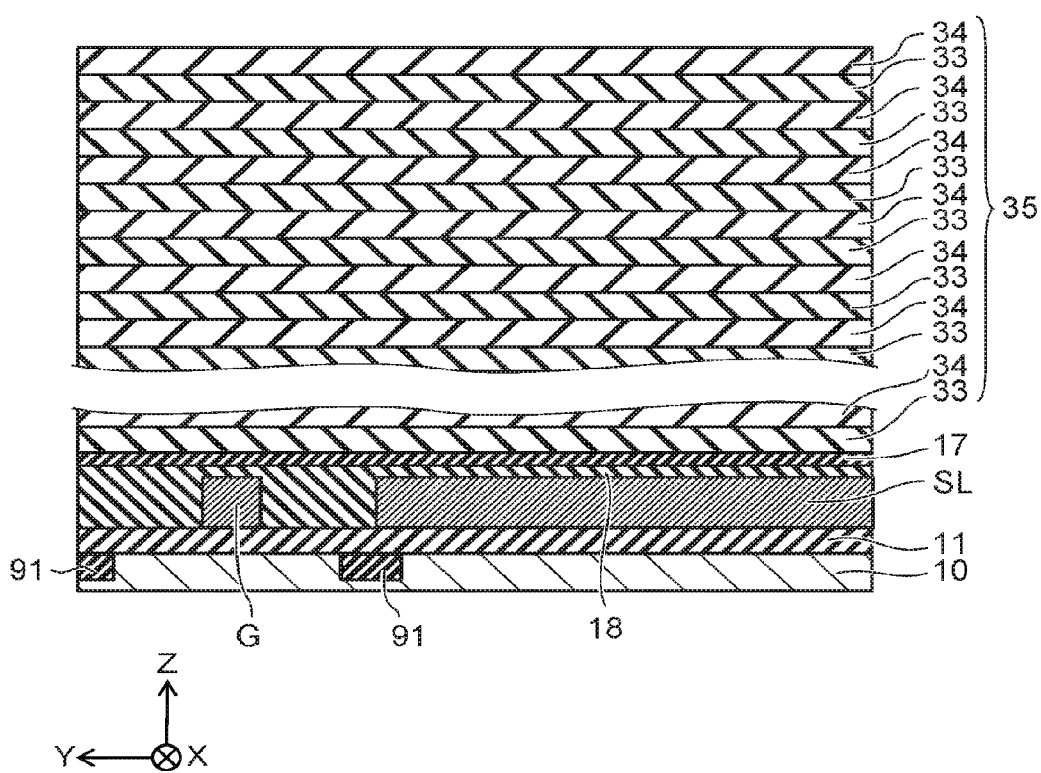
FIG. 6 is a cross-sectional view illustrating a method of manufacturing a semiconductor memory device according to an exemplary embodiment.

Next, as illustrated in FIG. 6, for example, the insulating film 33 and the filling film 34 are deposited on the insulating film 17 by the chemical vapor deposition method (CVD) to form the stacked body 35. The insulating film 33 includes, for example, silicon oxide. The filling film 34 includes, for example, silicon nitride.

Figure 7:
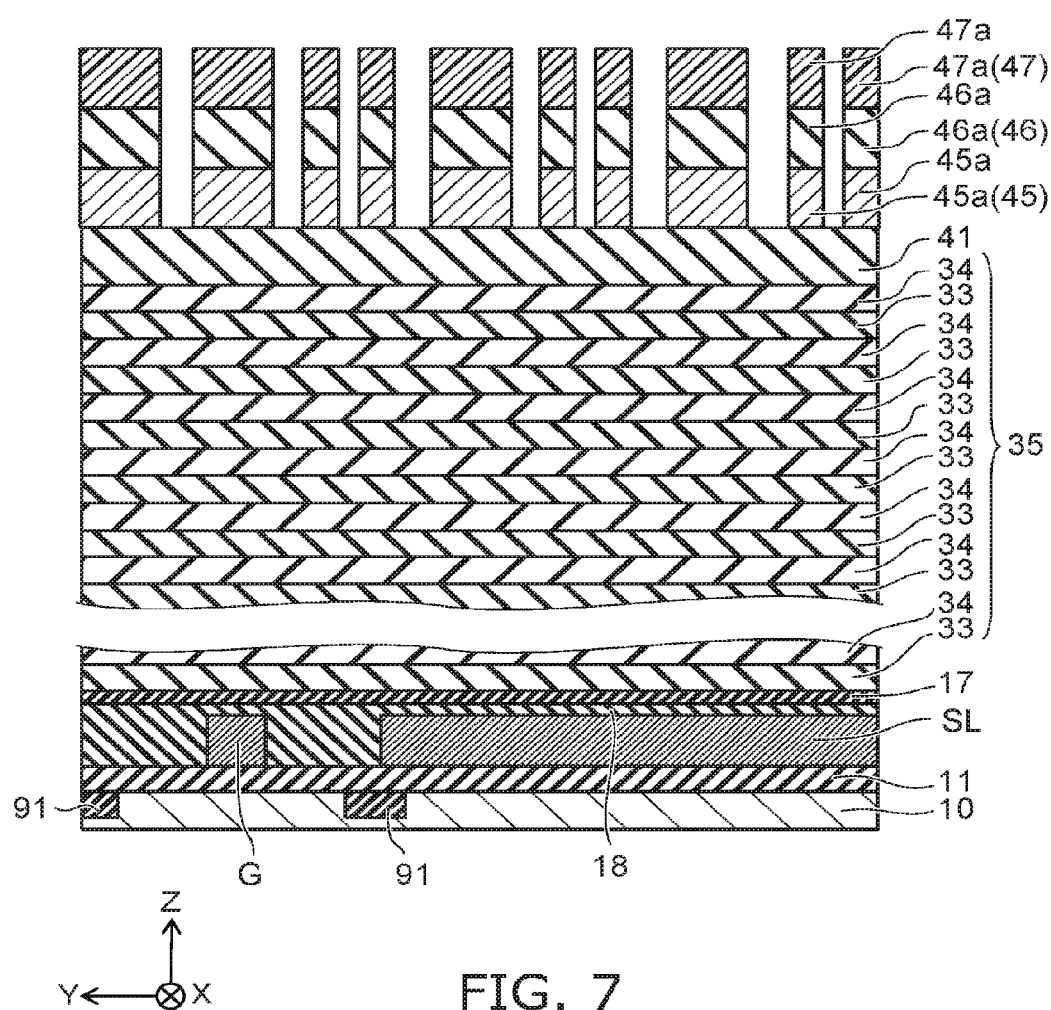
FIG. 7 is a cross-sectional view illustrating a method of manufacturing a semiconductor memory device according to an exemplary embodiment.

Next, as illustrated in FIG. 7, silicon oxide ($SiO_2$) is deposited on the stacked body 35 by the CVD method using, for example, tetra ethyl ortho silicate (TEOS: $Si(OC_2H_5)_4$) as a source material, to form a mask 41. A pattern film 45 is formed on the mask 41. The pattern film 45 is a film including, for example, carbon (C). An anti-reflective coating (ARC) 46 is formed on the pattern film 45. Next, a resist film 47 is formed on the anti-reflective coating 46.

Then, the resist film 47 is exposed to light and developed to form a resist pattern 47a. The resist pattern 47a extends in the Y-direction. Etching is carried out to form an anti-reflective coating 46a and a pattern film 45a. The anti-reflective coating 46a and the pattern film 45a extend in the Y-direction.

Figure 8:
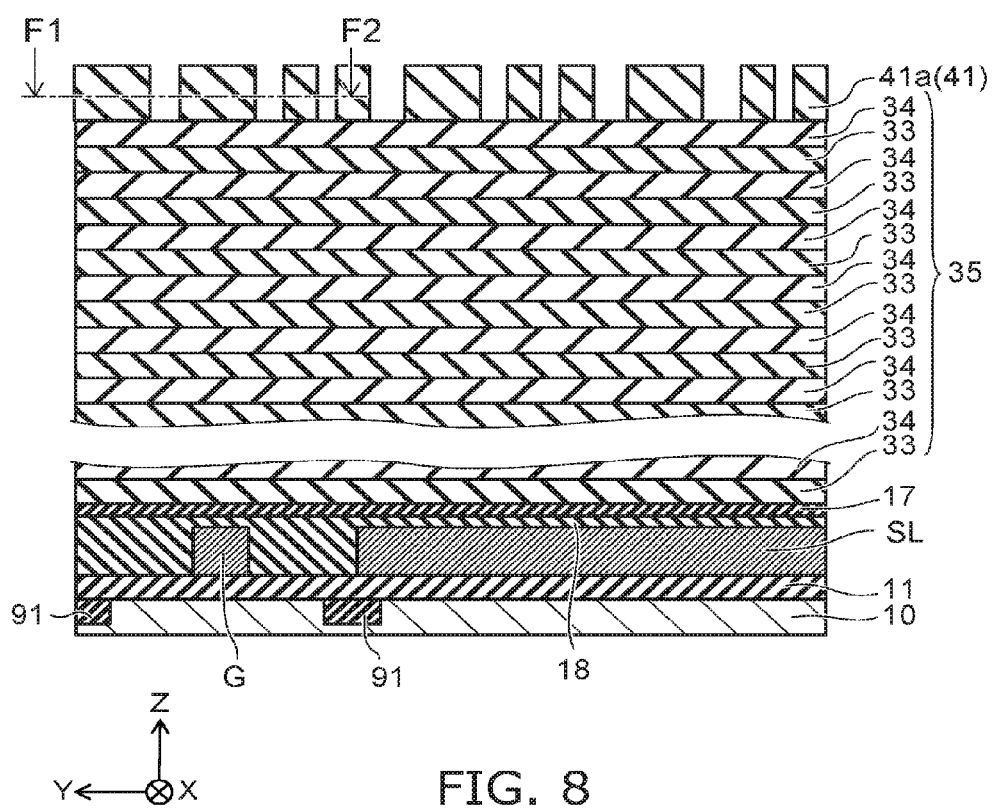
FIG. 8 is a cross-sectional view illustrating a method of manufacturing a semiconductor memory device according to an exemplary embodiment.

Next, as illustrated in FIG. 8, the mask 41 is patterned to form a mask 41a.

Figure 9:
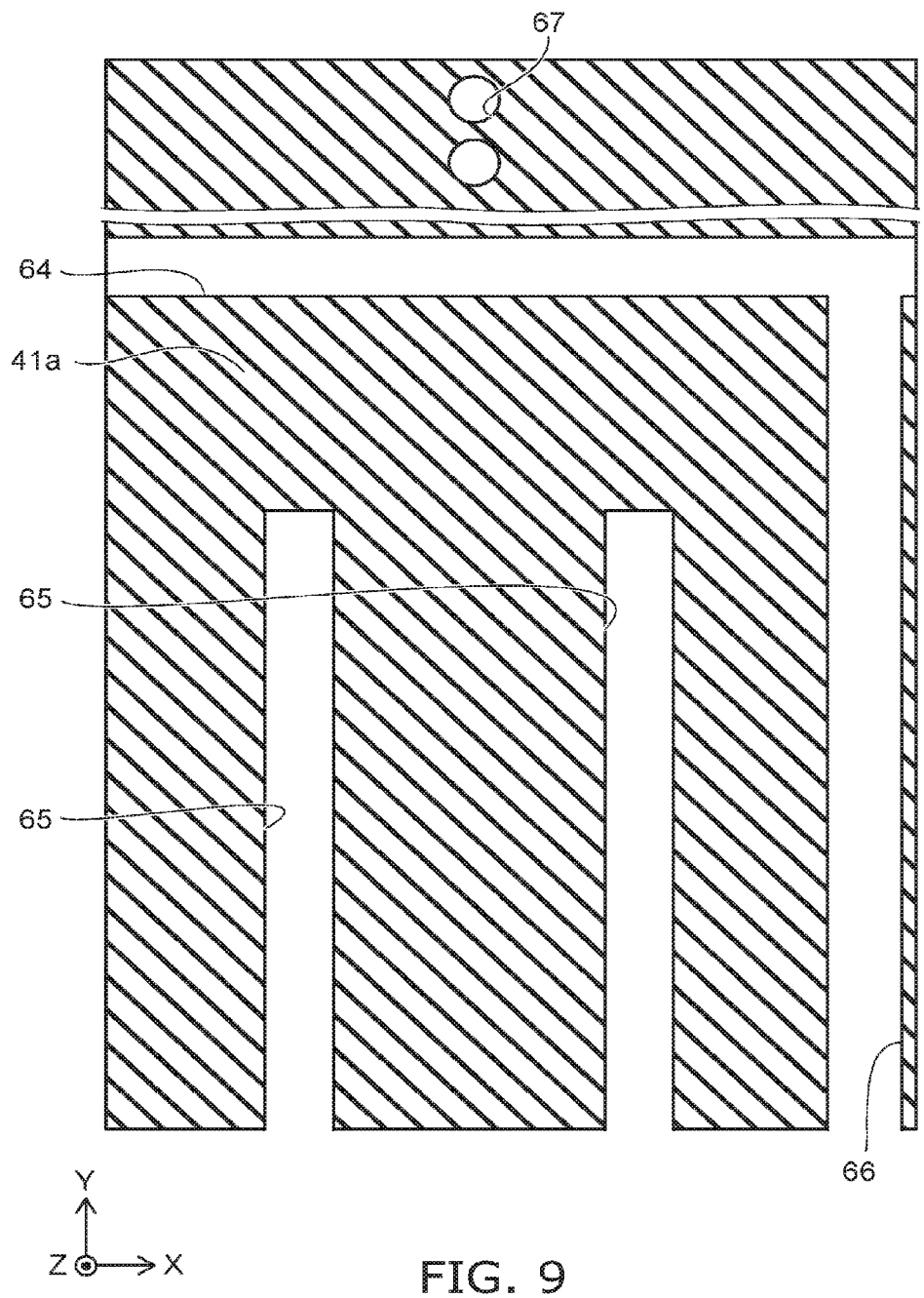
FIG. 9 is a cross-sectional view illustrating a method of manufacturing a semiconductor memory device according to an exemplary embodiment.

FIG. 9 is a schematic cross-sectional view taken along the line F1-F2 illustrated in FIG. 8.

As illustrated in FIG. 9, openings 64 to 67 are provided in the mask 41a. The opening 64 extends in the X-direction.

The opening 65 and the opening 66 extend in the Y-direction. The opening 65 and the opening 66 do not extend in the Y-direction to the position of the opening 67. The shape of the opening 67 in the XY plane is, for example, a circle.

Figure 10:
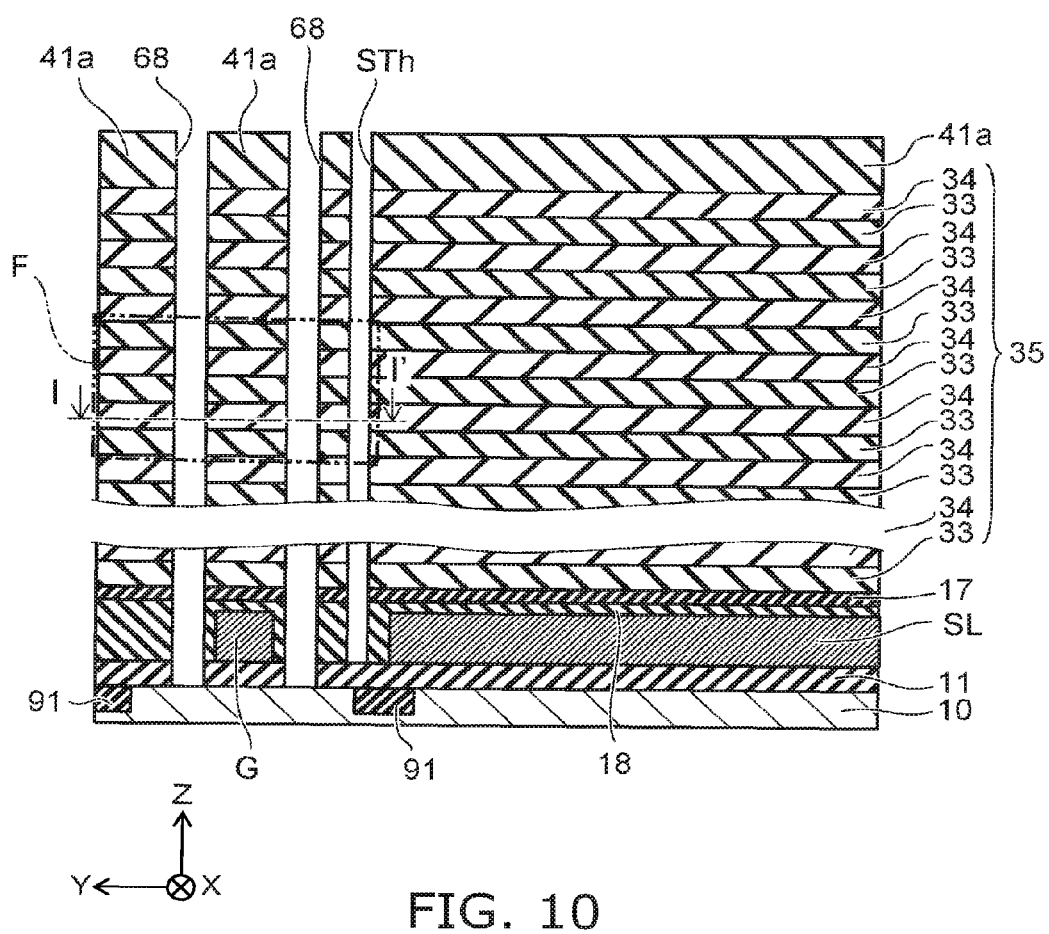
FIG. 10 is a cross-sectional view illustrating a method of manufacturing a semiconductor memory device according to an exemplary embodiment.
Figure 11:
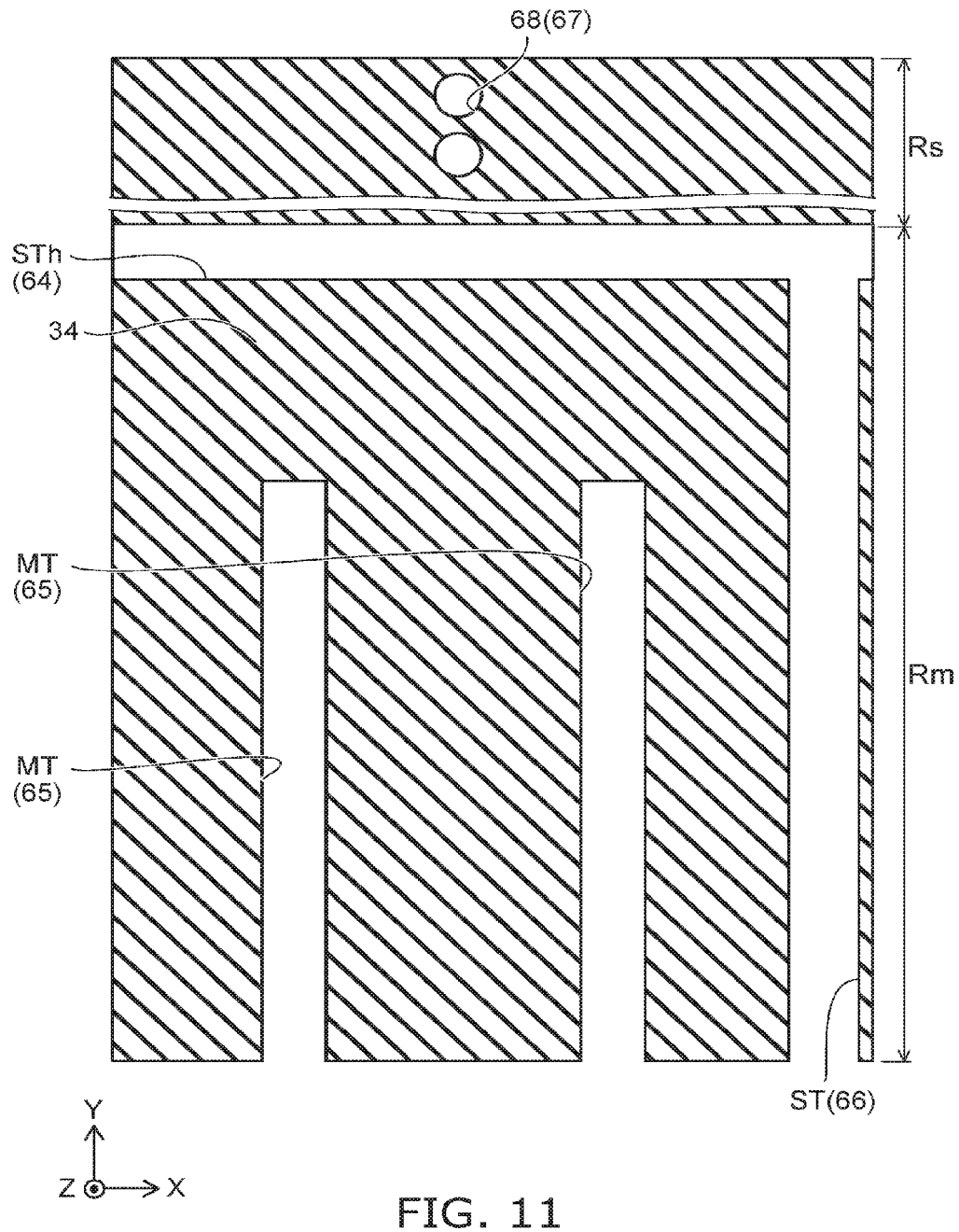
FIG. 11 is a cross-sectional view illustrating a method of manufacturing a semiconductor memory device according to an exemplary embodiment.

Next, as illustrated in FIG. 10 and FIG. 11, for example, wet etching is carried out using the mask 41a illustrated in FIG. 8 and FIG. 9 as the mask, and the stacked body 35 and the insulating film 17 are penetrated in the Z-direction. In this way, a memory cell trench MT, a slit ST, and a horizontal slit STh are formed penetrating the stacked body 35 and reaching as far as the source line SL in the memory region Rm, and two holes 68 are formed penetrating the stacked body 35 and reaching as far as the silicon substrate 10 in the peripheral region Rs. The memory cell trench MT, the slit ST, the horizontal slit STh, and the two holes 68 are formed simultaneously. The horizontal slit STh is formed with the opening 64. The memory cell trench MT is formed with the opening 65. The slit ST is formed with the opening 66. The hole 68 is formed with the opening 67.

Figure 12:
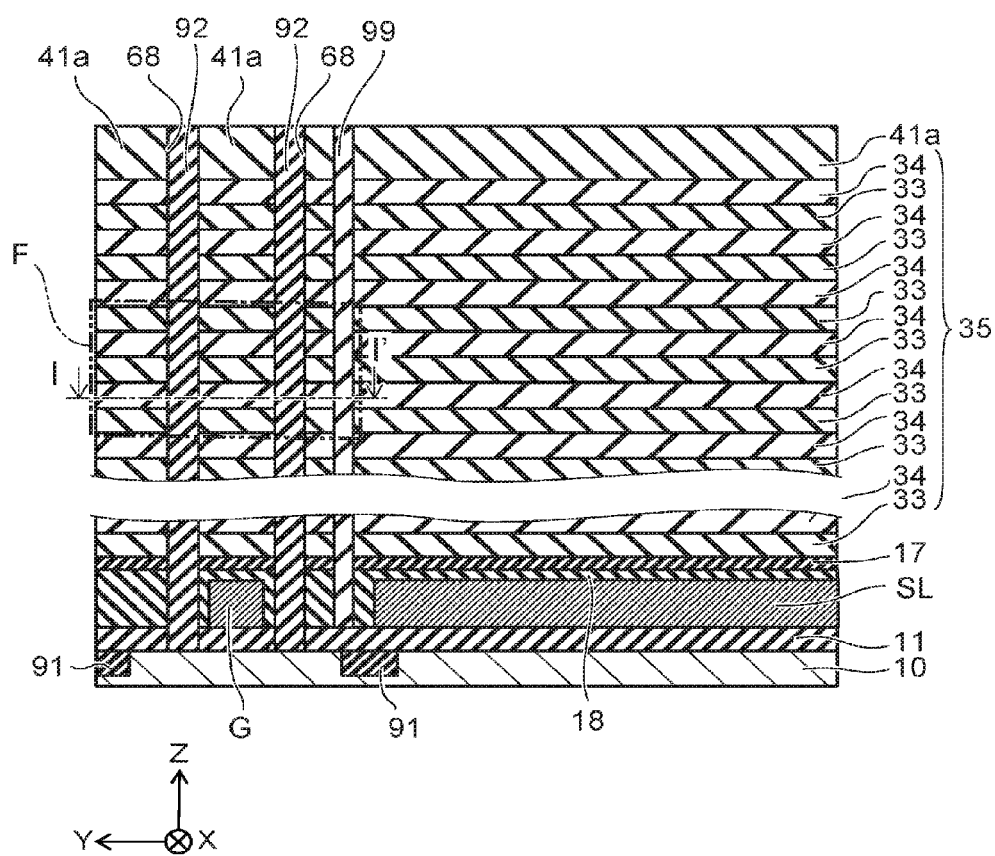
FIG. 12 is a cross-sectional view illustrating a method of manufacturing a semiconductor memory device according to an exemplary embodiment.
Figure 13:
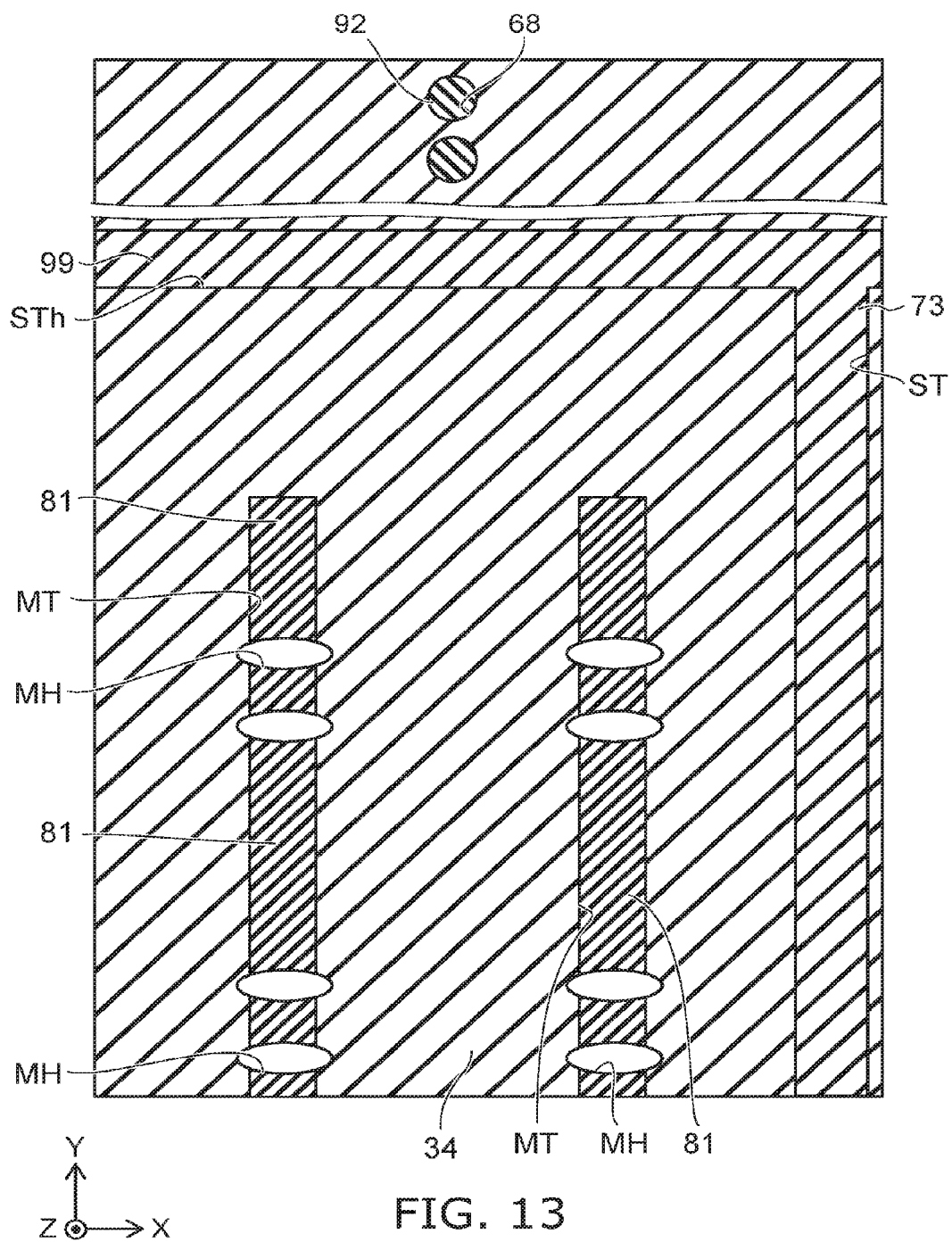
FIG. 13 is a cross-sectional view illustrating a method of manufacturing a semiconductor memory device according to an exemplary embodiment.

Next, as illustrated in FIG. 12 and FIG. 13, an insulating material such as a silicon oxide is deposited by, for example, a coating method. In this way, the insulating member 81 is formed within the memory cell trench MT, the insulating member 73 is formed within the slit ST, an insulating member 99 is formed within the horizontal slit STh, and the insulating member 92 is formed within the two holes 68.

Next, a memory hole MH is formed penetrating the insulating member 81 in the Z-direction. The insulating member 81 is divided in the Y-direction by the memory hole MH.

Figure 14:
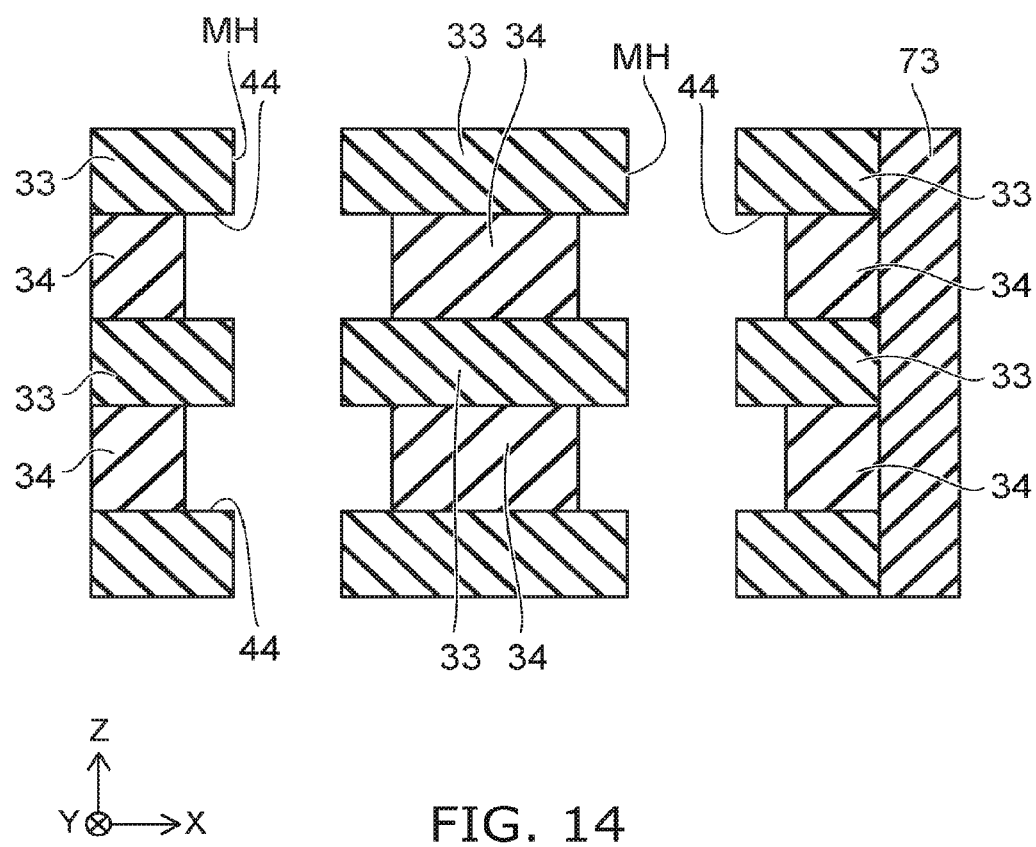
FIG. 14 is a cross-sectional view illustrating a method of manufacturing a semiconductor memory device according to an exemplary embodiment.

Next, as illustrated in FIG. 14, wet etching is carried out via the memory hole MH using as etchant hot phosphoric acid ($H_3PO_4$), which is a chemical that removes silicon nitride. In this way, a portion of the filling film 34 is removed on the side of the memory hole MH, and an indentation 44 is formed on the side face of the memory hole MH.

Figure 15:
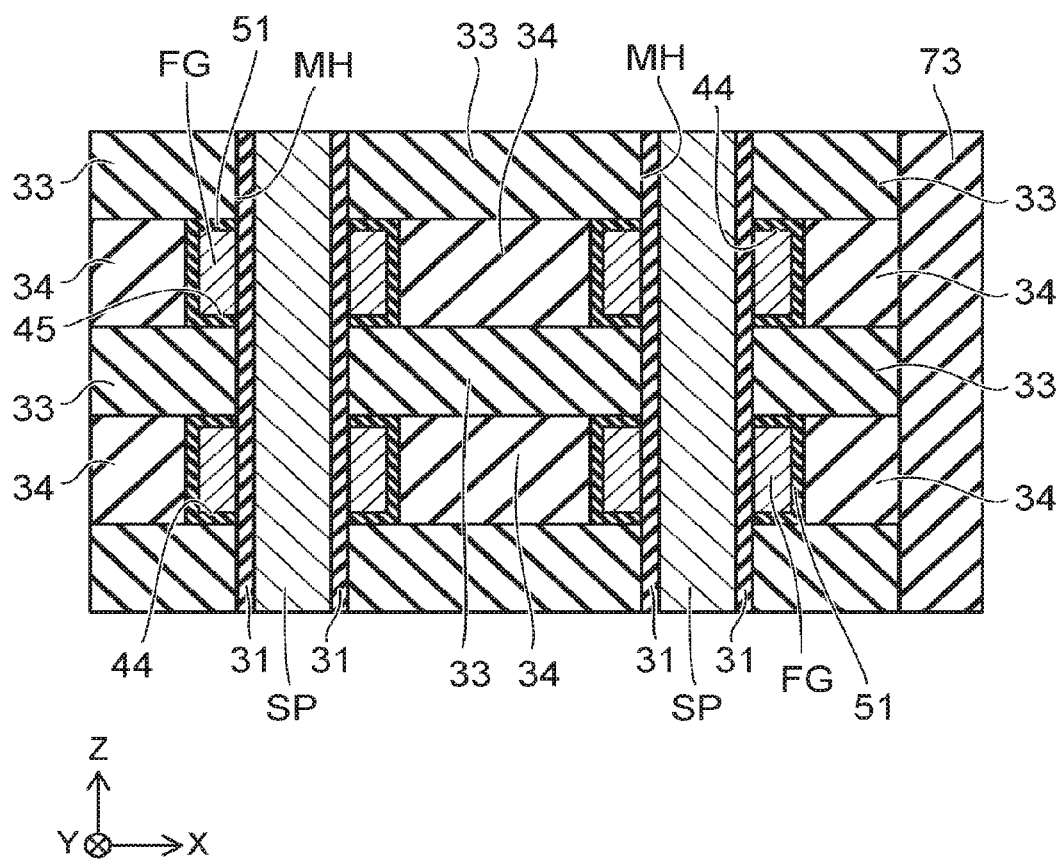
FIG. 15 is a cross-sectional view illustrating a method of manufacturing a semiconductor memory device according to an exemplary embodiment.
Figure 16:
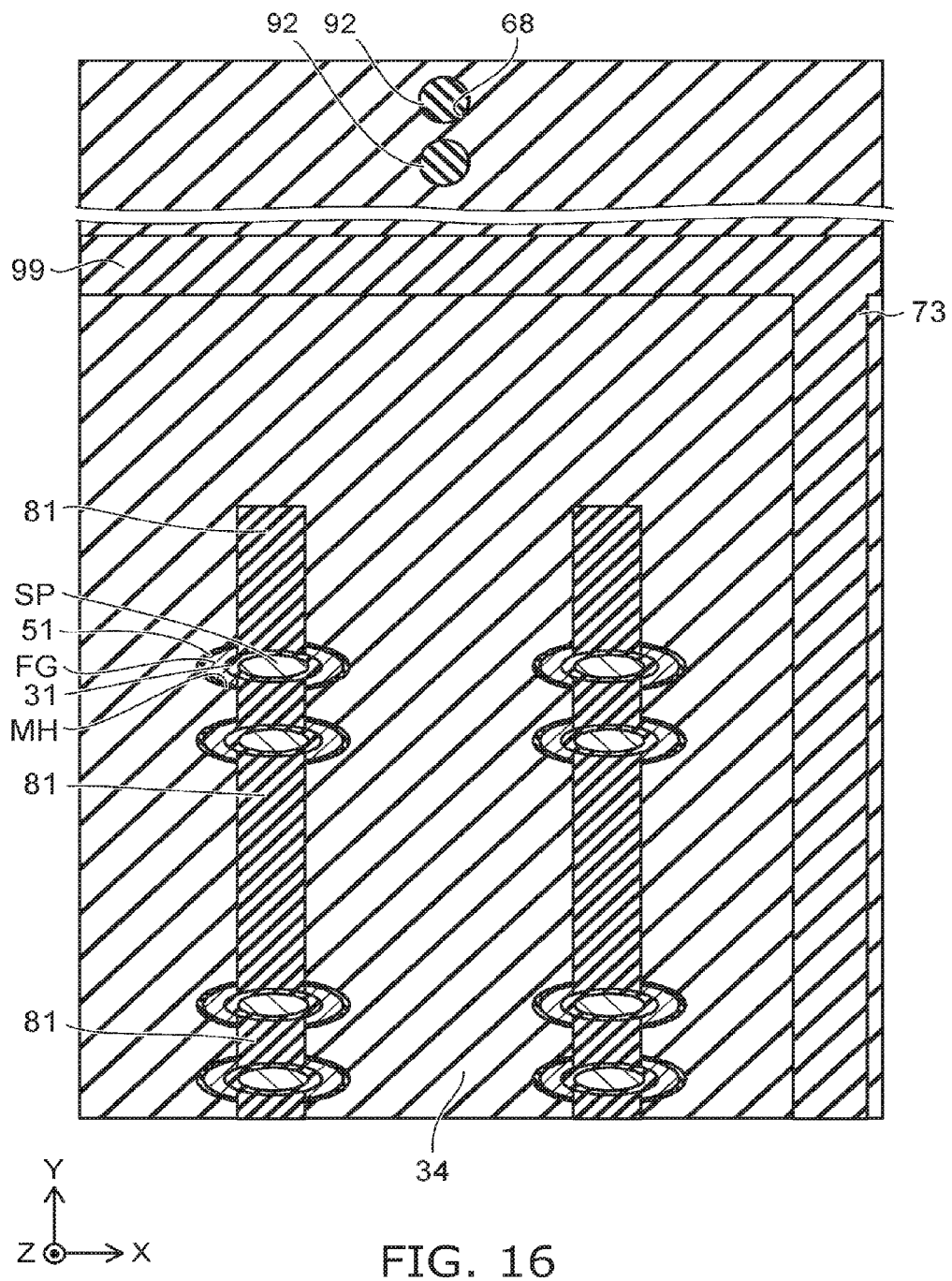
FIG. 16 is a cross-sectional view illustrating a method of manufacturing a semiconductor memory device according to an exemplary embodiment.

Next, as illustrated in FIG. 15 and FIG. 16, for example an insulating material is deposited on the side face of the memory hole MH and the inner faces of the indentation 44, to form the block insulating film 51. For example, polysilicon is deposited on the surface of the block insulating film 51 to form the floating gate electrode film FG. Silicon oxide, for example, is deposited on a side face of the memory hole MH to form the tunnel insulating film 31. For example, amorphous silicon is embedded within the memory hole MH. An annealing treatment is carried out to crystallize the amorphous silicon to form the silicon pillars SP.

Figure 17:
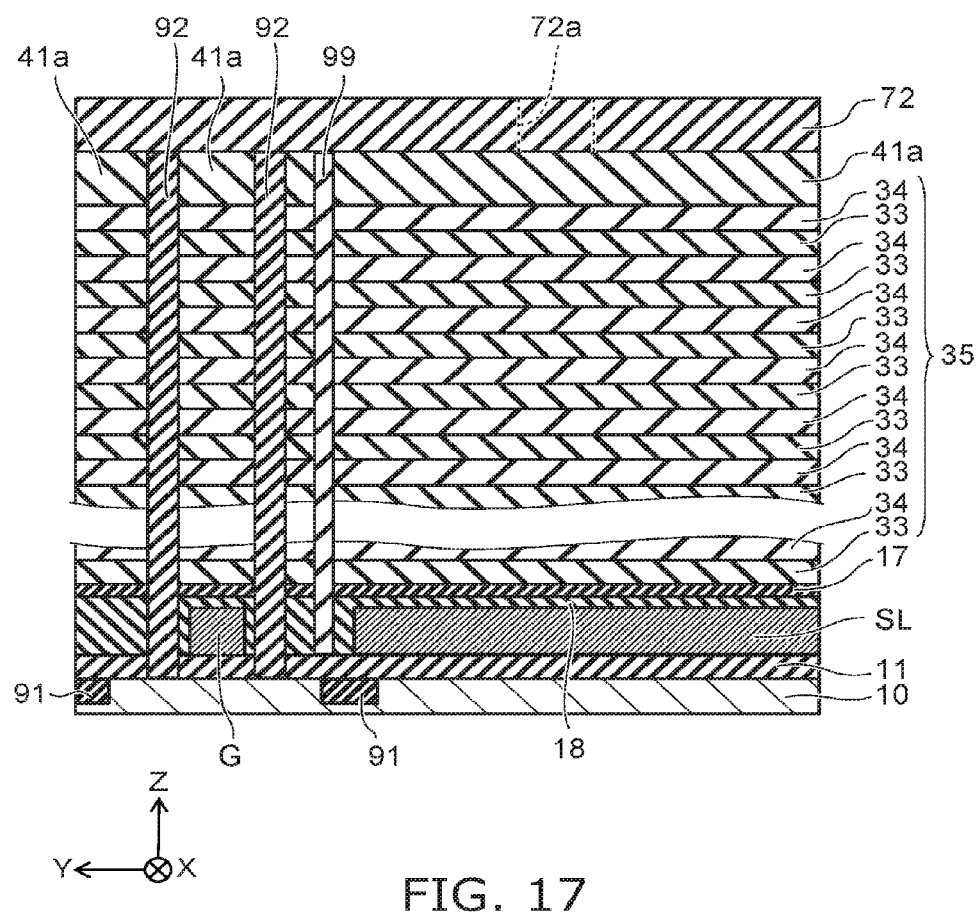
FIG. 17 is a cross-sectional view illustrating a method of manufacturing a semiconductor memory device according to an exemplary embodiment.

As illustrated in FIG. 17, a hard mask 72 is formed on the mask 41a. An opening 72a is provided in the hard mask 72. The opening 72a of the hard mask 72 is disposed over the insulating member 81.

Figure 18:
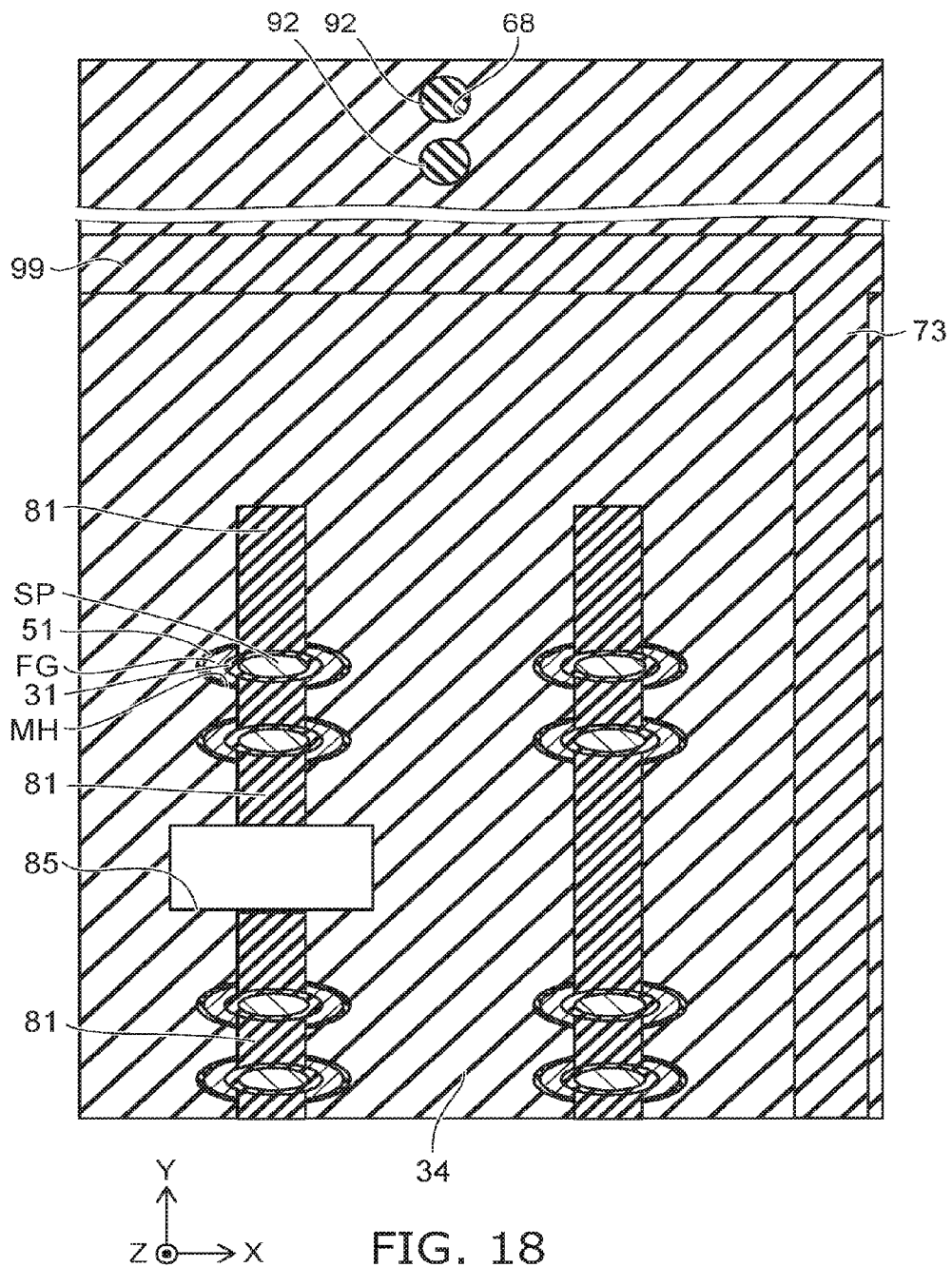
FIG. 18 is a cross-sectional view illustrating a method of manufacturing a semiconductor memory device according to an exemplary embodiment.

As illustrated in FIG. 18, for example, wet etching is carried out using the hard mask 72 as a mask to remove a portion of the insulating film 33, a portion of the filling film 34, and a portion of the insulating member 81. In this way, a through hole 85 is formed below the opening of the hard mask 72. The insulating member 81 is divided in the Y-direction by the through hole 85.

Figure 19:
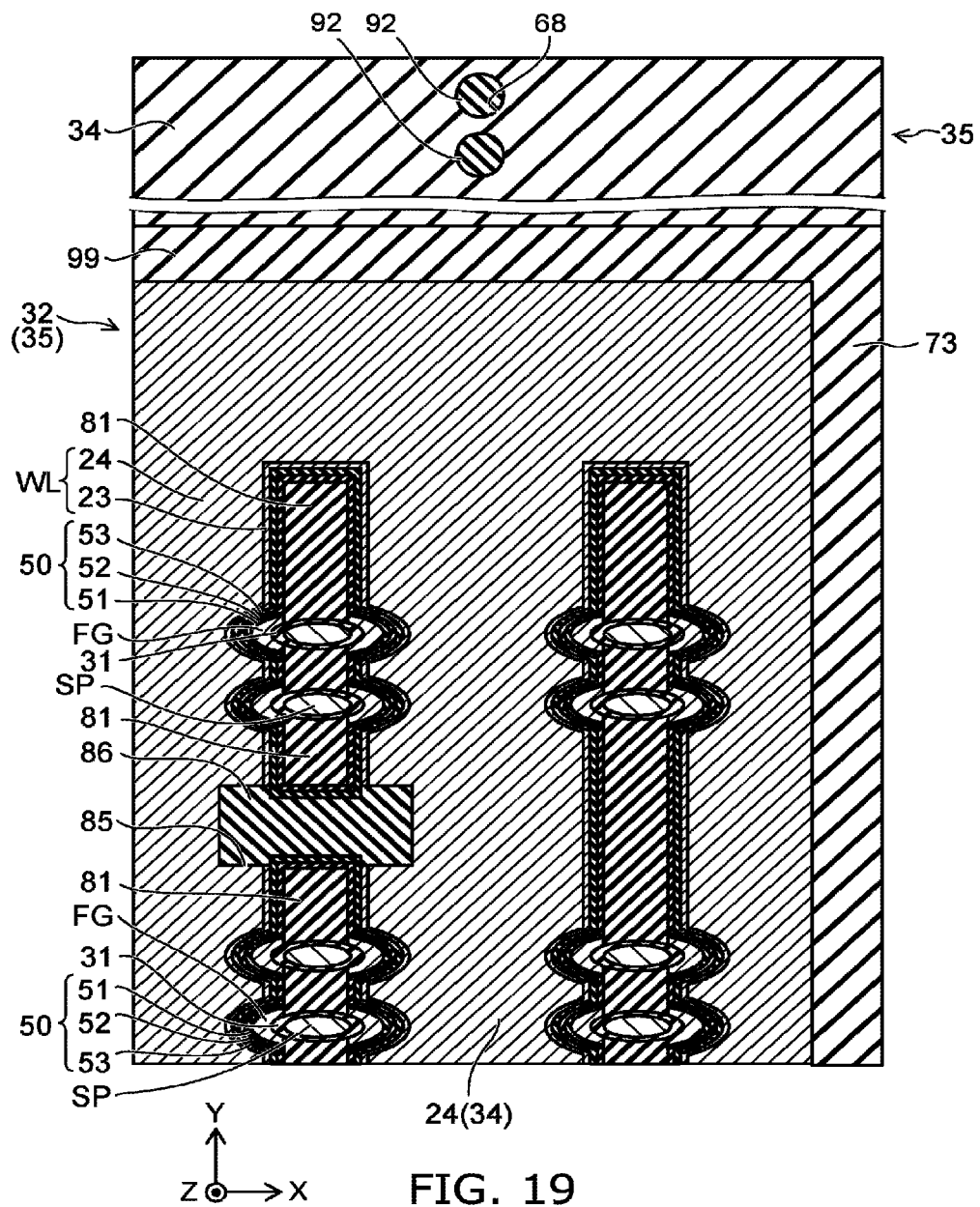
FIG. 19 is a cross-sectional view illustrating a method of manufacturing a semiconductor memory device according to an exemplary embodiment.

As illustrated in FIG. 19, the filling film 34 connecting with the through hole 85 is removed by wet etching via the through hole 85. For example, hot phosphoric acid is used for the wet etching. At this time, the etching liquid is stopped by the insulating member 73 and the insulating member 99, so it remains within the memory region Rm, and does not penetrate into the peripheral region Rs. As a result, after the filling film 34 is removed within the memory region Rm, a space is formed. On the other hand, the filling film 34 is not removed within the peripheral region Rs.

Next, the block insulating film 52 is formed on the inner surfaces of the space via the through hole 85. The block insulating film 53 is formed on the surface of the block insulating film 52. The barrier metal film 23 is formed on the surface of the block insulating film 53. The conductive member 24 is formed on the surface of the barrier metal film 23. The electrode film 13 is formed by the barrier metal film 23 and the conductive member 24. In this way, in the memory region Rm, the filling film 34 is replaced by the electrode film 13, and the stacked body 32 is formed in which the word lines WL and the insulating films 33 are alternately stacked. On the other hand, in the peripheral region Rs, the stacked body 35 remains the same.

Next, for example, silicon oxide is embedded in the through hole 85, to form the insulating member 86. The hard mask 72 is removed from the stacked body 32.

Figure 20:
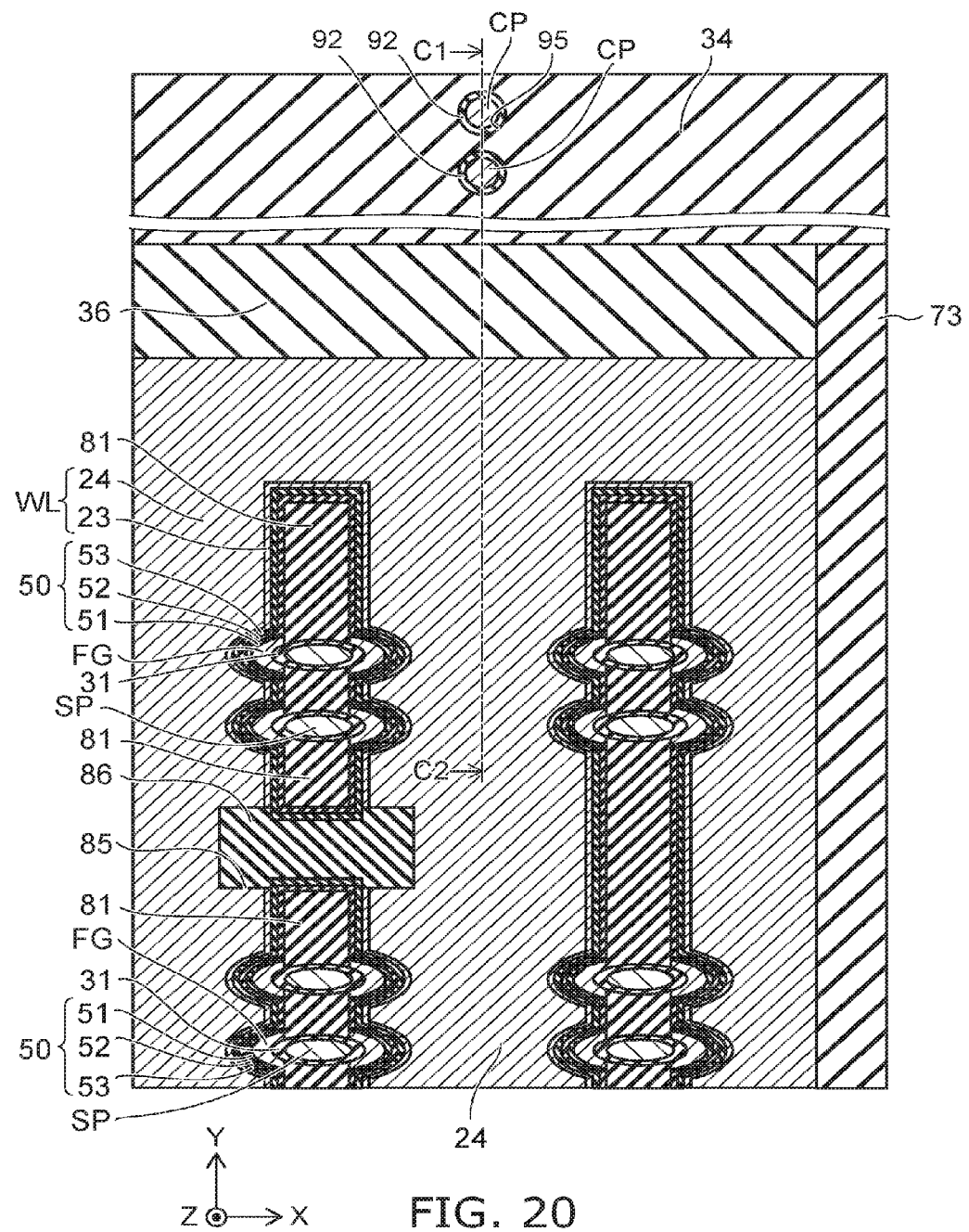
FIG. 20 is a cross-sectional view illustrating a method of manufacturing a semiconductor memory device according to an exemplary embodiment.
Figure 21:
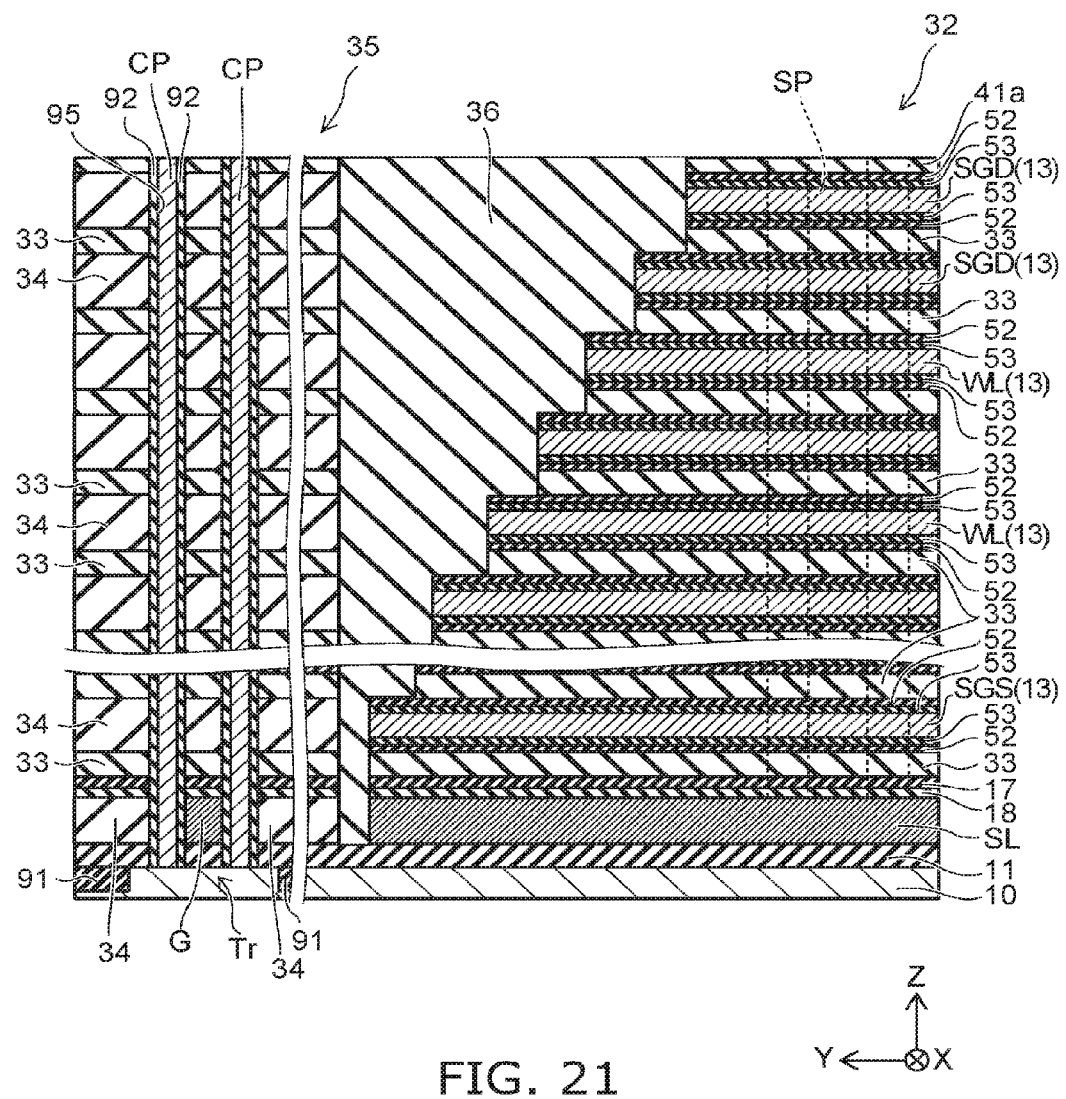
FIG. 21 is a cross-sectional view illustrating a method of manufacturing a semiconductor memory device according to an exemplary embodiment.

As illustrated in FIG. 20 and FIG. 21, the end portion of the stacked body 32 in the Y-direction is processed into a stairs shape. At this time, the stacked body 35 of the peripheral region Rs is not removed but remains. Therefore, a large step is not formed between the peripheral region Rs and the memory region Rm. In this way, several processes in order to eliminate this step are not necessary. The end portion of the stacked body 35 on the stacked body 32 side is not processed into a stairs shape, but is a substantially vertical side face.

Next, the interlayer insulating film 36 is formed by depositing insulating material. Next, a planarizing process such as chemical mechanical polishing (CMP) is carried out on the top face of the interlayer insulating film 36. As stated above, the stacked body 32 is formed in the memory region Rm, and the stacked body 35 is formed in the peripheral regions Rs, so there is no large step between the memory region Rm and the peripheral region Rs. Therefore the planarizing process is easy. Note that in the following, the insulating member 99 is described as a portion of the interlayer insulating film 36.

Next, two holes 95 are formed by penetrating the two insulating members 92 in the Z-direction, reaching as far as the silicon substrate 10. The insulating member 92 remains around the hole 95. Conductive material is embedded in each of the two holes 95 to form two conductive pillars CP reaching as far as the silicon substrate 10.

As illustrated in FIG. 1 to FIG. 3, a contact hole 39h is formed by penetrating the insulating member 73 in the Z-direction reaching as far as the source line SL. For example, tungsten is embedded within the contact hole 39h to form the contact 39. The interconnection L4 is formed on the contact 39. The insulating member 71 is formed on the stacked body 32, the interconnection L4, and the interlayer insulating film 36.

A contact hole 28h is formed by penetrating the insulating member 71 in the Z-direction reaching as far as the silicon pillars SP. For example, tungsten is embedded within the contact hole 28h to form the contact 28. The bit line BL is formed on the contact 28 extending in the X-direction.

The contact 27 is formed by penetrating the insulating member 71 extending in the Z-direction as far as the drain-side select gate electrode SGD, at the end portion E of the drain-side select gate electrode SGD. The interconnection L3 is formed on the contact 27 extending in the Y-direction. Likewise, the contact 38, the interconnection L2, the contact 37, and the interconnection L1 are formed.

A contact hole 88h is formed by penetrating the insulating member 71 in the Z-direction reaching as far as the conductive pillar CP. For example, tungsten is embedded within the contact hole 88h to form the contact 88. The interconnection L5 is formed on the contact 88 extending in the X-direction.

As a result of the above, the semiconductor memory device 1 is formed.

In the embodiment, in the processes illustrated in FIG. 6, the insulating film 33 made from silicon oxide and the filling film 34 made from silicon nitride are deposited alternately, to form the stacked body 35, and in the process illustrated in FIG. 19, the filling film 34 is replaced by the electrode film 13 in the memory region Rm only, to form the stacked body 32. At this time, in the peripheral region Rs, the stacked body 35 remains. In this way, there is no step between the peripheral region Rs and the memory region Rm. As a result, planarizing the top face of the interlayer insulating film 36 is easy. Also, several processes in order to eliminate this step are not necessary. As a result, the number of manufacturing processes can be reduced.

In contrast, assuming the stacked body 35 is removed from the peripheral region Rs, a large step would be formed at the boundary between the peripheral region Rs and the memory region Rm. As a result, planarizing the top face of the interlayer insulating film 36 would be difficult.

Also, in the peripheral region Rs, the insulating filling film 34 is not replaced by the electrode film 13, so there is no problem of breakdown voltage or short-circuit between the conductive pillar CP and the electrode film 13.

In addition, in the embodiment, by dividing the conductive layer 12, the source line SL and the gate electrode G of the transistor Tr are formed simultaneously. In this way, the gate electrode G can be easily formed when the stacked body 35 remains in the peripheral region Rs. Also, special processes are not required to fabricate the gate electrode G of the transistor Tr. In this way, the number of manufacturing processes for the semiconductor memory device can be reduced.

In addition, in the embodiment, in the processes illustrated in FIG. 18, the hole-shaped through hole 85 is formed, and in the processes illustrated in FIG. 19, the filling film 34 is replaced by the electrode film 13 via the through hole 85. In this way, the degree of integration of the silicon pillars SP in the X-direction can be increased compared with when linear through holes are formed extending in the Y-direction. As a result, the degree of integration of the memory cells in the semiconductor memory device 1 can be increased.

The embodiments described above can provide a semiconductor memory device and method for manufacturing such a semiconductor memory device with a reduced number of manufacturing processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a semiconductor substrate;
    a first insulating film provided on the semiconductor substrate;
    a first conductive film provided on a first region of the first insulating film;
    a second conductive film provided on a second region of the first insulating film;
    a first stacked body provided on the first conductive film, in which a second insulating film and an electrode film are stacked alternately along a first direction from the semiconductor substrate towards the first insulating film;
    a second stacked body provided on the second conductive film and a region in a periphery of the second conductive film, in which a third insulating film and a first film are stacked alternately in the first direction, the first film being insulating;
    a first semiconductor pillar extending in the first direction through the first stacked body, connected at a bottom end of the first semiconductor pillar to the first conductive film;
    two conductive pillars extending in the first direction through the second stacked body, separated from the second conductive film, and connected at bottom ends of the two conductive pillars to the semiconductor substrate, the second conductive film being disposed between the two conductive pillars; and
    a charge storage member provided between the first semiconductor pillar and the electrode film.

2. The semiconductor memory device according to claim 1, wherein a distance between the semiconductor substrate and the first conductive film is equal to a distance between the semiconductor substrate and the second conductive film.

3. The semiconductor memory device according to claim 1, wherein a thickness of the first conductive film is equal to a thickness of the second conductive film.

4. The semiconductor memory device according to claim 1, wherein an average composition of the first conductive film is equal to an average composition of the second conductive film.

5. The semiconductor memory device according to claim 1, wherein a thickness of the second insulating film is equal to a thickness of the third insulating film.

6. The semiconductor memory device according to claim 1, wherein an average composition of the second insulating film is equal to an average composition of the third insulating film.

7. The semiconductor memory device according to claim 1, further comprising:
    a second semiconductor pillar extending in the first direction through the first stacked body, provided on a side of a second direction intersecting with the first direction relative to the first semiconductor pillar, and connected at a bottom end of the second semiconductor pillar to the first conductive film; and
    a first insulating member provided between the first semiconductor pillar and the second semiconductor pillar, penetrating the first stacked body.

8. The semiconductor memory device according to claim 7, further comprising:
    a second insulating member penetrating the first stacked body; and
    a fourth insulating film provided between the charge storage member and the electrode film, and, between the first insulating member and the electrode film, and not provided between the second insulating member and the electrode film.

9. The semiconductor memory device according to claim 1, further comprising a fifth insulating film provided on a periphery of each of the conductive pillars.

10. The semiconductor memory device according to claim 9, further comprising:
- a second semiconductor pillar extending in the first direction through the first stacked body, provided on a side of a second direction intersecting with the first direction relative to the first semiconductor pillar, and connected at a bottom end of the second semiconductor pillar to the first conductive film; and
- a first insulating member provided between the first semiconductor pillar and the second semiconductor pillar, penetrating the first stacked body,
    - a composition of the first insulating film being equal to a composition of the fifth insulating film.

11. The semiconductor memory device according to claim 1, wherein a shape of an end portion of the first stacked body on a side of the second stacked body is a stairs shape formed with a step at each electrode film, and
- a shape of an end portion of the second stacked body on a side of the first stacked body is a substantially vertical side face.

* * * * *